United States Patent
Kim (10) Patent No.: US 7,870,470 B2
(45) Date of Patent: Jan. 11, 2011

(54) METHOD AND APPARATUS FOR DETECTING SYNCHRONIZATION OF BROADCASTING CHANNEL IN AN ASYNCHRONOUS MOBILE COMMUNICATION SYSTEM

(75) Inventor: Oh-Seok Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 990 days.

(21) Appl. No.: 11/710,862

(22) Filed: Feb. 26, 2007

(65) Prior Publication Data

US 2007/0245216 A1  Oct. 18, 2007

(30) Foreign Application Priority Data

Feb. 24, 2006 (KR) .................... 10-2006-0018477

(51) Int. Cl.
*H03M 13/03* (2006.01)
(52) U.S. Cl. ..................................... 714/795
(58) Field of Classification Search ................ 714/746, 714/758, 774, 794–795
See application file for complete search history.

(56) References Cited

U.S. PATENT DOCUMENTS 7,228,491 B2 *   6/2007  Oki ........................... 714/794
7,281,195 B2 *  10/2007  Murata et al. ............... 714/774

* cited by examiner

*Primary Examiner*—Shelly A Chase
(74) *Attorney, Agent, or Firm*—The Farrell Law Firm, LLP (57) ABSTRACT

An apparatus for detecting synchronization of a Broadcasting Channel (BCH) in an asynchronous mobile communication system. A Viterbi decoder calculates a zero state path metric and a minimum path metric through an Add-Compare-Select (ACS) process and a trace-back process while decoding a frame of a received BCH. A Cyclic Redundancy Check (CRC) checker performs CRC check on the decoded BCH frame. A controller detects Transmission Time Interval (TTI) synchronization of the received BCH using the CRC check result and a result obtained by comparing a difference between the zero state path metric and the minimum path metric with a threshold.

39 Claims, 9 Drawing Sheets

METHOD AND APPARATUS FOR DETECTING SYNCHRONIZATION OF BROADCASTING CHANNEL IN AN ASYNCHRONOUS MOBILE COMMUNICATION SYSTEM

PRIORITY

This application claims the benefit under 35 U.S.C. §119(a) of a Korean Patent Application filed in the Korean Intellectual Property Office on Feb. 24, 2006 and assigned Serial No. 2006-18477, the disclosure of which is incorporated herein by reference.

BACKGROUND OF THE INVENTION

1. Field of the Invention

The present invention generally relates to a method and apparatus for detecting synchronization in a mobile communication system, and in particular, to a method and apparatus for detecting synchronization during demodulation of a Primary Common Control Physical Channel (PCCPCH) in an asynchronous mobile communication system.

2. Description of the Related Art

With the rapid development of communication technology, mobile communication systems have reached the phase of providing not only general voice communication service but also a high-speed data service capable of supporting a multimedia service. A packet data system providing the high-speed data service is roughly classified into a synchronous system adopted in the United States and an asynchronous system adopted in Europe and Japan, and the synchronous and asynchronous systems undergo different standardizations according to their standard groups.

The synchronous packet data system managed by $3^{rd}$ Generation Partnership Project 2 (3GPP2) is evolving into Code Division Multiple Access (CDMA) 2000 1x currently in service, Evolution Data Only (1x EV-DO) capable of high-speed packet transmission, and Evolution of Data and Voice (EV-DV) capable of supporting both voice and packet services, and the asynchronous packet data system managed by 3GPP includes Universal Mobile Telecommunication Systems (UMTS), which is also called Wideband-CDMA (W-CDMA).

A description will now be made of a frame synchronization detection technology for a Broadcasting Channel (BCH) among the synchronization detection technologies applied to UMTS.

In UMTS, a User Equipment (UE) of a subscriber acquires 10-ms frame synchronization through an initial cell search process. The UE matches timing synchronization of a forward link through a forward broadcasting channel, i.e. BCH, and acquires information related to a Random Access Channel (RACH). The BCH is carried on a PCCPCH.

The UE decodes a 10-ms PCCPCH frame for 20 ms (Transmission Time Interval (TTI) of a BCH), and delivers the decoded PCCPCH frame to an upper layer in a TTI size. Therefore, because the BCH has 20-ms frame synchronization, the UE should correctly detect synchronization of a PCCPCH frame having a 20-ms TTI boundary in order to correctly decode the BCH.

Figure 1:
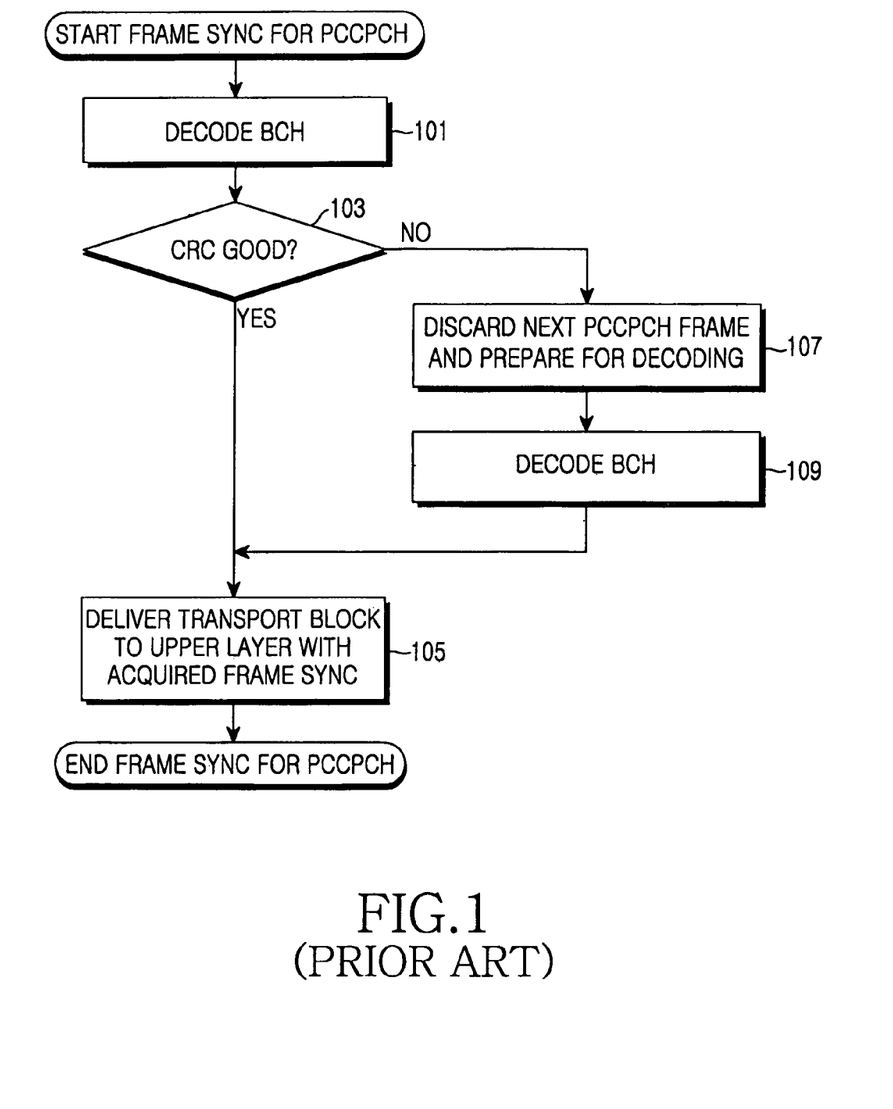
FIG. 1 is a flowchart illustrating a method for detecting synchronization of a BCH in a conventional asynchronous mobile communication system.

FIG. 1 shows a method for detecting synchronization of a BCH in a conventional asynchronous mobile communication system. The conventional method shown in FIG. 1 performs BCH decoding, and then matches a TTI boundary of a BCH using a Cyclic Redundancy Check (CRC) result on the decoded BCH.

According to the conventional technology, in order to acquire frame synchronization of a PCCPCH having a 20-ms TTI boundary, a UE receives and decodes a 20-ms BCH in step 101.

In step 103, the UE performs a CRC check on the decoded data. If the CRC result is "Good," the UE determines that it has correctly detected synchronization of a BCH, and if the CRC result is "Bad," the UE determines that it has failed to detect synchronization of a BCH. That is, if the CRC result is "Good," the UE determines that a TTI boundary between a UMTS Terrestrial Radio Access Network (UTRAN) and the UE is matched. If the CRC result is "Bad," the UE determines that the TTI boundary between the UTRAN and the UE is mismatched.

Therefore, if the CRC result is "Good" in step 103, the UE proceeds to step 105 where it delivers a transport block obtained by decoding a BCH to an upper layer with the acquired frame synchronization. However, if the CRC result is "Bad" in step 103, the UE proceeds to step 107 where it discards the next 10-ms PCCPCH frame and then prepares for decoding of a PCCPCH frame. In step 109, the UE receives and decodes a 20-ms BCH, and then proceeds to step 105 where it delivers a transport block obtained by decoding the BCH to an upper layer with the acquired frame synchronization.

The conventional synchronization detection method matches a TTI boundary by shifting a mismatched TTI boundary of a UE one frame. If a TTI boundary between a UTRAN and a UE is mismatched by one frame as shown by reference D1 of FIG. 8, the CRC result on a decoded BCH will be "Bad." It is possible to match the TTI boundary between the UTRAN and the UE with a method of shifting a TTI boundary of the UE 10 ms (one frame).

However, in a poor radio environment, a CRC result on a decoded BCH that is "Bad" even though the TTI boundary is matched occurs frequently. Therefore, when the CRC result is "Bad," it is hard to determine whether the "Bad" CRC result is due to the mismatch of the TTI boundary, or due to the poor radio environment. If the "Bad" CRC result has occurred in the condition where the TTI boundary is matched and the radio environment is not good, the UE using the method described in FIG. 1 shifts the TTI boundary, determining that the TTI boundary is not matched. A "Bad" CRC result will necessarily occur in the next TTI, and as a result, the UE should shift again the TTI boundary.

Therefore, for the "Bad" CRC result caused by the poor radio environment, the UE should observe a change in CRC results on a BCH decoded for more TTIs, and shift the TTI boundary according to the observation result. In this way, the conventional BCH synchronization detection method requires a long time in order to detect a reliable TTI boundary. In particular, when the UE performs BCH decoding to obtain information on neighbor cells after awaking from a sleep state, the use of the conventional method requires a longer time, causing a reduction in performance of the UE.

SUMMARY OF THE INVENTION

An aspect of the present invention is to address at least the problems and/or disadvantages described above and to provide at least the advantages described below. Accordingly, an aspect of the present invention is to provide a method and apparatus for efficiently detecting synchronization during demodulation of a Primary Common Control Physical Channel (PCCPCH) in an asynchronous mobile communication system.

Another aspect of the present invention is to provide a synchronization detection method and apparatus capable of reducing a time for decoding a Broadcasting Channel (BCH) in an asynchronous mobile communication system.

Further another aspect of the present invention is to provide a method and apparatus for detecting synchronization using a characteristic of a Viterbi decoder and a Cyclic Redundancy Check (CRC) result on a BCH in an asynchronous mobile communication system.

According to one aspect of the present invention, there is provided a method for detecting Transmission Time Interval (TTI) synchronization of a BCH in an asynchronous mobile communication system. The method includes calculating a zero state path metric and a minimum path metric through an Add-Compare-Select (ACS) process and a trace-back process during frame decoding of a received BCH; performing CRC check on the decoded BCH frame; and detecting TTI synchronization using the CRC check result and a result obtained by comparing a difference between the zero state path metric and the minimum path metric with a threshold.

According to another aspect of the present invention, there is provided an apparatus for detecting synchronization of a BCH in an asynchronous mobile communication system. The apparatus includes a Viterbi decoder for calculating a zero state path metric and a minimum path metric through an ACS process and a trace-back process while decoding a frame of a received BCH; a CRC checker for performing CRC check on the decoded BCH frame; and a controller for detecting TTI synchronization of the received BCH using the CRC check result and a result obtained by comparing a difference between the zero state path metric and the minimum path metric with a threshold.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention increases detection probability of Transmission Time Interval (TTI) synchronization using both a Cyclic Redundancy Check (CRC) result on a decoded Broadcasting Channel (BCH) and a characteristic of a Viterbi decoder included in a User Equipment (UE) to detect a reliable TTI boundary in matching a TTI boundary between a UMTS Terrestrial Radio Access Network (UTRAN) and a UE for decoding of a Broadcasting Channel (BCH) in a UMTS system, thereby reducing the time for BCH decoding.

As for a characteristic of a Viterbi decoder used for increasing detection probability of TTI synchronization in the present invention, a difference between a zero state path metric and a minimum path metric, obtained during trace-back from an end position of a BCH decoder has a very small value when the TTI boundary is matched.

Figure 10:
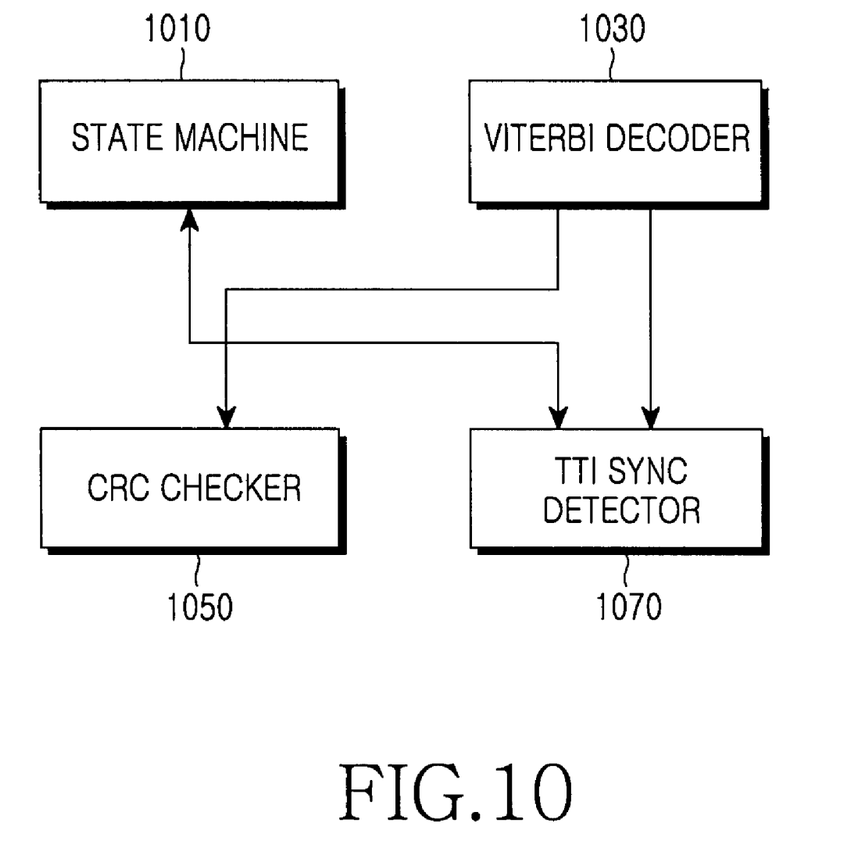
FIG. 10 is a block diagram illustrating an internal structure of a synchronization detection apparatus in an asynchronous mobile communication system according to the present invention.

FIG. 10 shows an internal structure of a synchronization detection apparatus in an asynchronous mobile communication system according to the present invention.

The synchronization detection apparatus includes a state machine 1010, a Viterbi decoder 1030, a CRC checker 1050, and a TTI synchronization detector 1070. The state machine 1010 performs a STATE transition operation and a STATE count operation, predetermined for TTI synchronization detection for each CASE of Table 2. The Viterbi decoder 1030 decodes a frame of a received BCH, and outputs a zero state path metric and a minimum path metric calculated through an Add-Compare-Select (ACS) process and a Trace-back process during the decoding. The CRC checker 1050 performs CRC check on the decoded BCH frame data. The TTI synchronization detector 1070 determines whether TTI synchronization is detected using a result obtained by comparing a difference between the zero state path metric and the minimum path metric with a threshold, and the CRC result, and detects TTI synchronization by selectively performing STATE transition and/or STATE count through the state machine 1010 for every frame until TTI synchronization detection.

Figure 2:
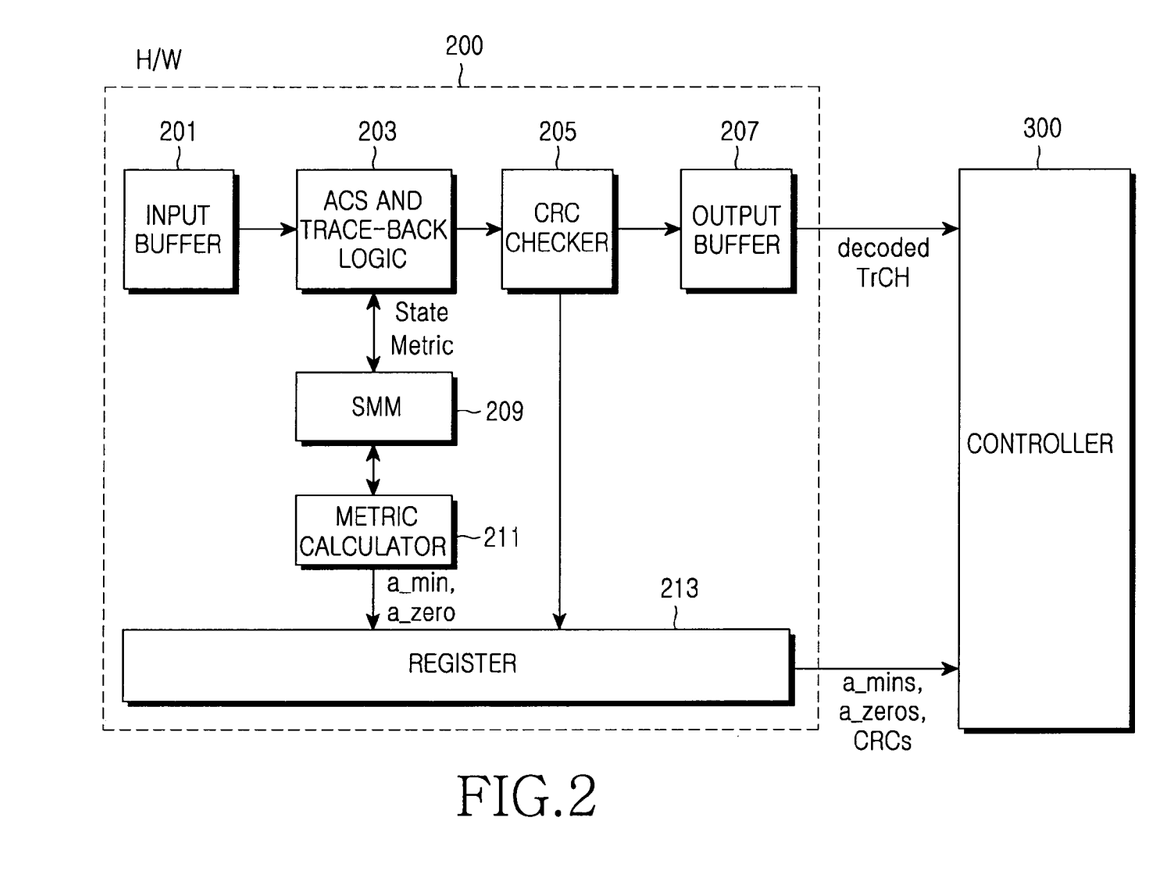
FIG. 2 is a block diagram illustrating an internal structure of a Viterbi decoder according to the present invention.

Although the CRC checker 1050 shown in FIG. 10 is separated from the Viterbi decoder 1030 for convenience, it can be included in the Viterbi decoder 1030, as with the Viterbi decoder 200 shown in FIG. 2.

With reference to Table 1, a description will now be made of a channel format of a BCH to which the present invention is applicable.

As shown in Table 1, a BCH is transmitted over a PCCPCH, and because its coding type is Viterbi coding, it can use a characteristic of a Viterbi decoder. In addition, because a transport channel format of the BCH is 1×246, the Viterbi decoder has only one end position.

TABLE 1

| Transport Format Set | | | |
|---|---|---|---|
| PCCPCH | TrCH type | | BCH |
| | TFS | TF0, bits | 1 × 246 |
| | TTI, ms | | 20 |
| | Coding Type | | Convolutional Coding 1/2 |
| | CRC, bit | | 16 |
| | RM attribute | | Invalid |

FIG. 2 shows an internal structure of a Viterbi decoder according to the present invention.

Figure 3:
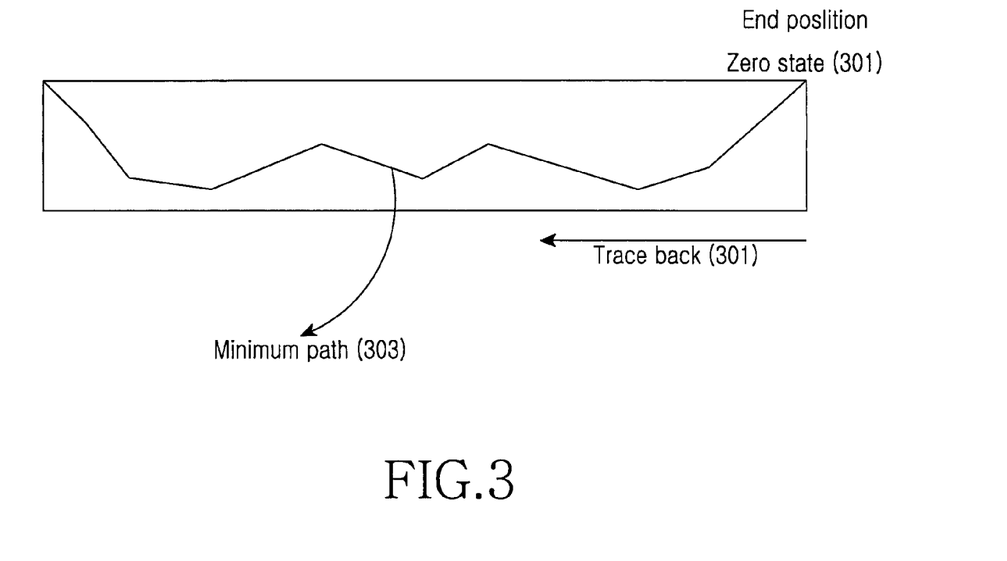
FIG. 3 is a diagram illustrating a trace-back operation of a Viterbi decoder for calculating a zero state path metric and a minimum path metric according to the present invention.

In a Viterbi decoder 200 of FIG. 2, an input buffer 201 delivers frame data received over a BCH to an ACS and trace-back block 203. For decoding of the received frame, the ACS and trace-back block 203 performs an ACS process of selecting an optimal path from an end position of each state metric delivered from a State Metric Memory (SMM) 209, and a trace-back process of tracing the past optimal state and outputting decoded data. The ACS and trace-back block 203 delivers a zero state path metric and a minimum path metric calculated through the ACS process and the trace-back process to the SMM 209. FIG. 3 shows a trace-back operation of the Viterbi decoder 200 for calculating the zero state path metric and the minimum path metric.

The data (TrCH) decoded through the ACS and trace-back block 203 is delivered to a controller 300 via a CRC checker 205 for error detection and an output buffer 207. A metric calculator 211 detects the zero state path metric a_zero and the minimum path metric a_min from the SMM 209, and stores them in a register 213, and the CRC checker 205 also stores CRC check results in the register 213. The zero state path metric a_zero, minimum path metric a_min, and CRC check results stored in the register 213 are delivered to the controller 300.

In FIG. 2, the controller 300 can be construed as a structure including the TTI synchronization detector 1070 and the state machine 1010 of FIG. 10. Therefore, the controller 300 performs a synchronization detection operation of determining whether a TTI boundary between a UTRAN and a UE is matched, using CRC check results CRCs and a result obtained by combining a difference between the zero state path metric a_zero and the minimum path metric a_min with a threshold, and then performs inter-STATE transition.

Figure 8:
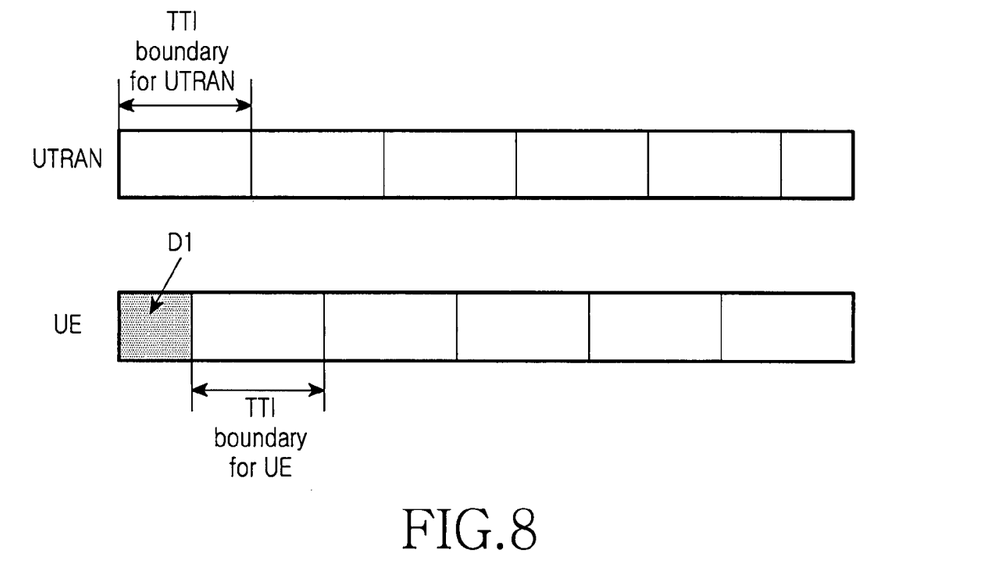
FIG. 8 is a diagram illustrating a state in which TTI synchronization between a UTRAN and a UE is not matched.
Figure 9:
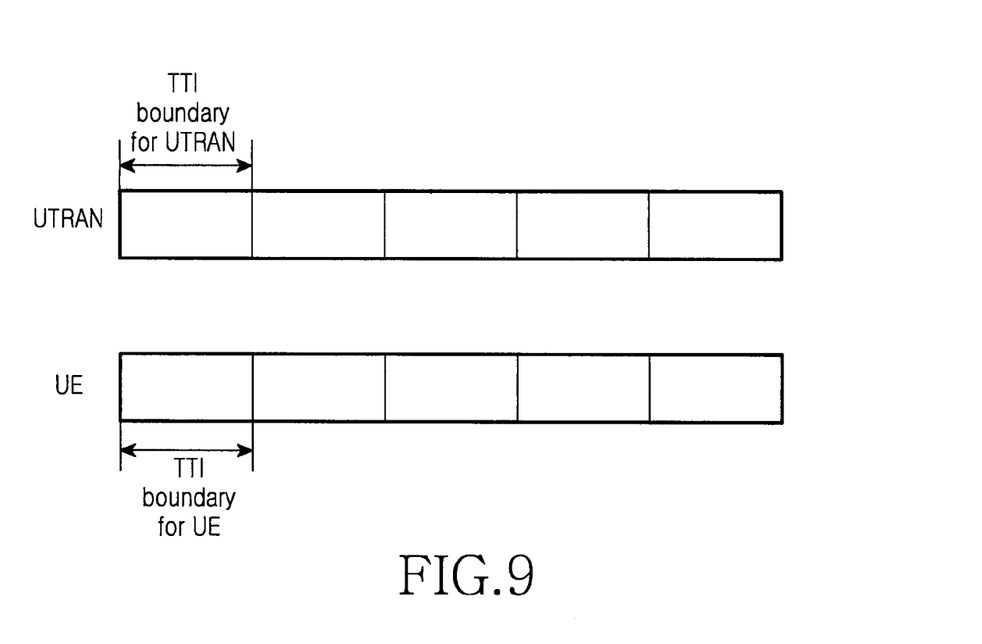
FIG. 9 is a diagram illustrating a state in which TTI synchronization between a UTRAN and a UE is matched.

When the TTI boundary is matched in the foregoing method, there are two possible TTI relationships between the UTRAN and the UE as shown in FIGS. 8 and 9.

When the TTI boundary between the UTRAN and the UE has a one-frame difference D1 as shown in FIG. 8, CRC results and a difference between a zero state path metric and a minimum path metric are also great. Compared with this, when the TTI boundary between the UTRAN and the UE is matched as shown in FIG. 9, there is a high CRC result="Good" possibility in a good radio environment. However, in a poor radio environment, even though the TTI boundary is matched, the CRC result may be "Bad." Even though the radio environment is poor, the difference between the zero state path metric and the minimum path metric has a small value. Therefore, when BCH synchronization is detected using the difference between the zero state path metric and the minimum path metric together with the CRC results as done in the present invention, it is possible to prevent a wrong decision on the TTI boundary between the UTRAN and the UE.

With reference to FIGS. 4 to 7, a description will now be made of an operation of the synchronization detection apparatus described in FIG. 10 according to the present invention.

Figure 7:
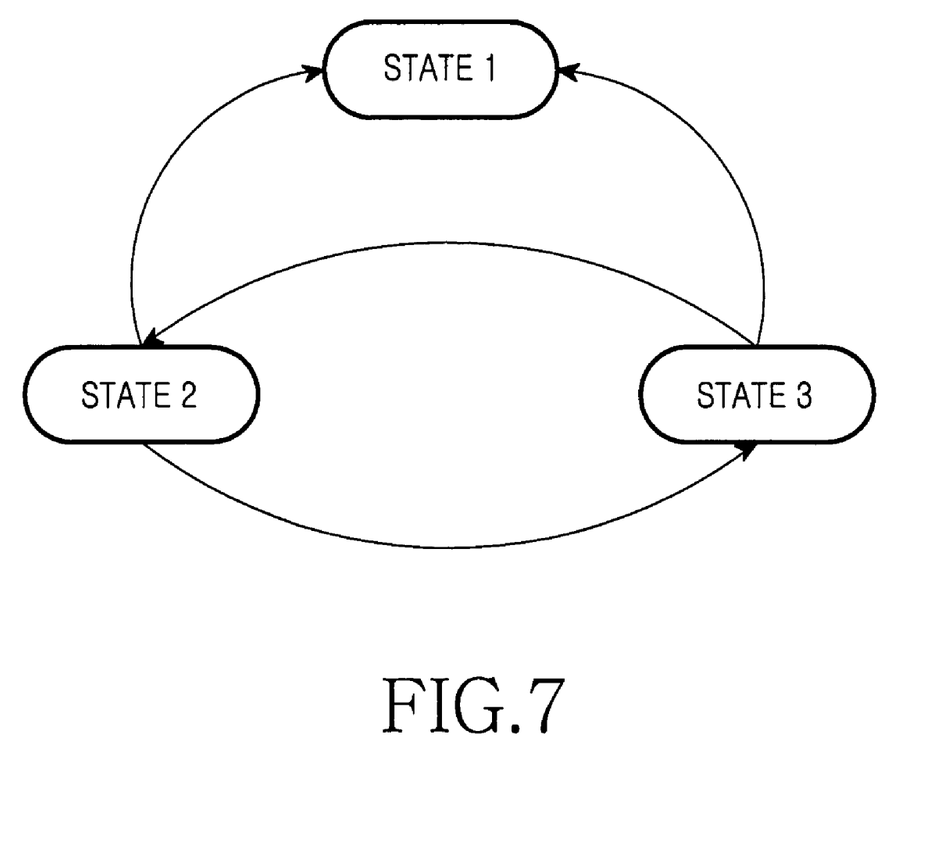
FIG. 7 is a diagram illustrating a transition relationship between STATEs defined in the present invention.

FIG. 7 shows a transition relationship between STATEs defined in the present invention. "STATE 1" means a state in which a TTI boundary between a UTRAN and a UE is matched, "STATE 2" means a state in which there is a need for an additional check in order to determine whether the TTI boundary between the UTRAN and the UE is matched, and "STATE 3" means a state in which the TTI boundary between the UTRAN and the UE is not matched.

Table 2 shows relationships between the STATEs described in FIG. 7, the CRC results, and the difference (hereinafter path metric difference) between zero state path metric and the minimum path metric, for Case 1 through Case 5. The state machine 1010 of the synchronization detection apparatus described in FIG. 10 performs a STATE transition operation and a STATE count operation for TTI synchronization detection according to CASEs of Table 2.

TABLE 2

| Cases | CRC result | Path metric difference (\|zero state path metric − minimum path metric\|) | SFN | Target STATE |
|---|---|---|---|---|
| Case 1 | Good | Path metric difference < specific value | Don't care | STATE 1 |
| Case 2 | Good | Path metric difference ≧ specific value | Current SFN = previous SFN + 2 (in case of state 2) | |
| Case 3 | Good | Path metric difference ≧ specific value | Don't care | STATE 2 |
| Case 4 | Bad | Path metric difference < specific value | | |
| Case 5 | Bad | Path metric difference ≧ specific value | Don't care | STATE 3 |

In Table 2, a specific value means a threshold compared with the path metric difference for determining whether a TTI boundary is matched, and SFN means a System Frequency Number.

Figure 4:
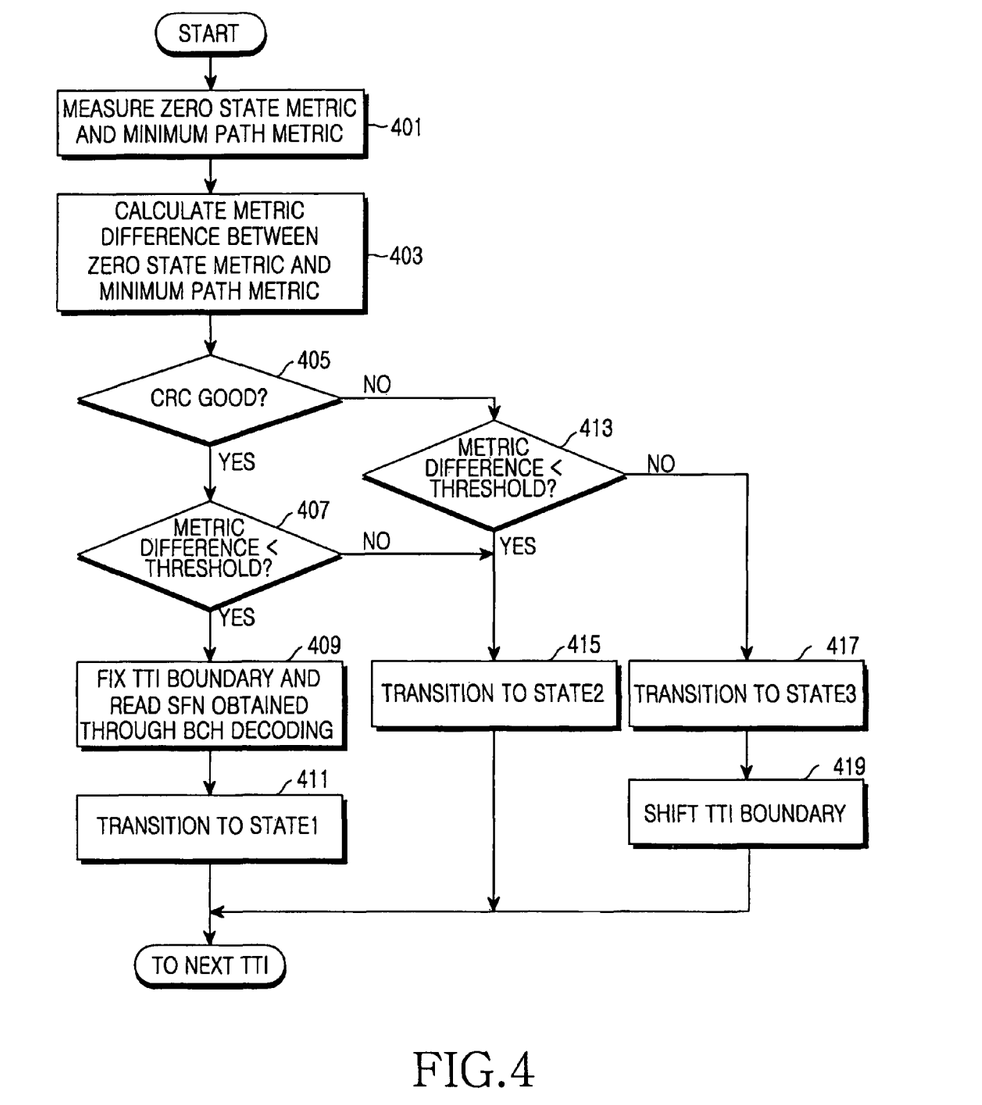
FIG. 4 is a flowchart illustrating an initial STATE operation of a synchronization detection apparatus according to the present invention.

FIG. 4 shows an initial STATE operation of a synchronization detection apparatus according to the present invention.

In an initial PCCPCH demodulation process, the synchronization detection apparatus of FIG. 10 performs a CRC check on a received frame and calculates a difference between a zero state path metric and a minimum path metric output from a Viterbi decoder in steps 401 and 403. If the CRC result is "Good" in step 405, the synchronization detection apparatus determines in step 407 whether the path metric difference is less than a threshold. If the path metric difference is less than the threshold, the synchronization detection apparatus keeps the current TTI boundary and uses SFN and system information obtained through BCH decoding in step 409, determining that a TTI boundary between a UTRAN and a UE is matched. In step 411, the synchronization detection apparatus transitions to "STATE 1." This corresponds to an operation of CASE 1 in Table 2.

If the CRC result is "Bad" in step 405, the synchronization detection apparatus determines in step 413 whether the path metric difference is less than a threshold. If the path metric difference is less than the threshold, the synchronization detection apparatus transitions to "STATE 2" in step 415, determining that there is a need for more information for determining whether the TTI boundary is matched, and then waits until the next TTI boundary. This corresponds to an operation of CASE 4 in Table 2.

Similarly, if the CRC result is "Good" but the path metric difference is greater than or equal to the threshold in step 407, the synchronization detection apparatus transitions to "STATE 2" in step 415, determining that there is a need for more information for determining whether the TTI boundary is matched, and then waits until the next TTI boundary. This corresponds to an operation of CASE 3 in Table 2.

If the CRC result is "Bad" and the path metric difference is also greater than or equal to the threshold in step 413, the synchronization detection apparatus transitions from the current state to "STATE 3" in step 417, determining that the TTI boundary between the UTRAN and the UE is mismatched, for example, one frame. In step 419, the synchronization detection apparatus shifts a TTI boundary of the UE one frame, and then waits until the next TTI boundary. This corresponds to an operation of CASE 5 in Table 2.

Figure 5:
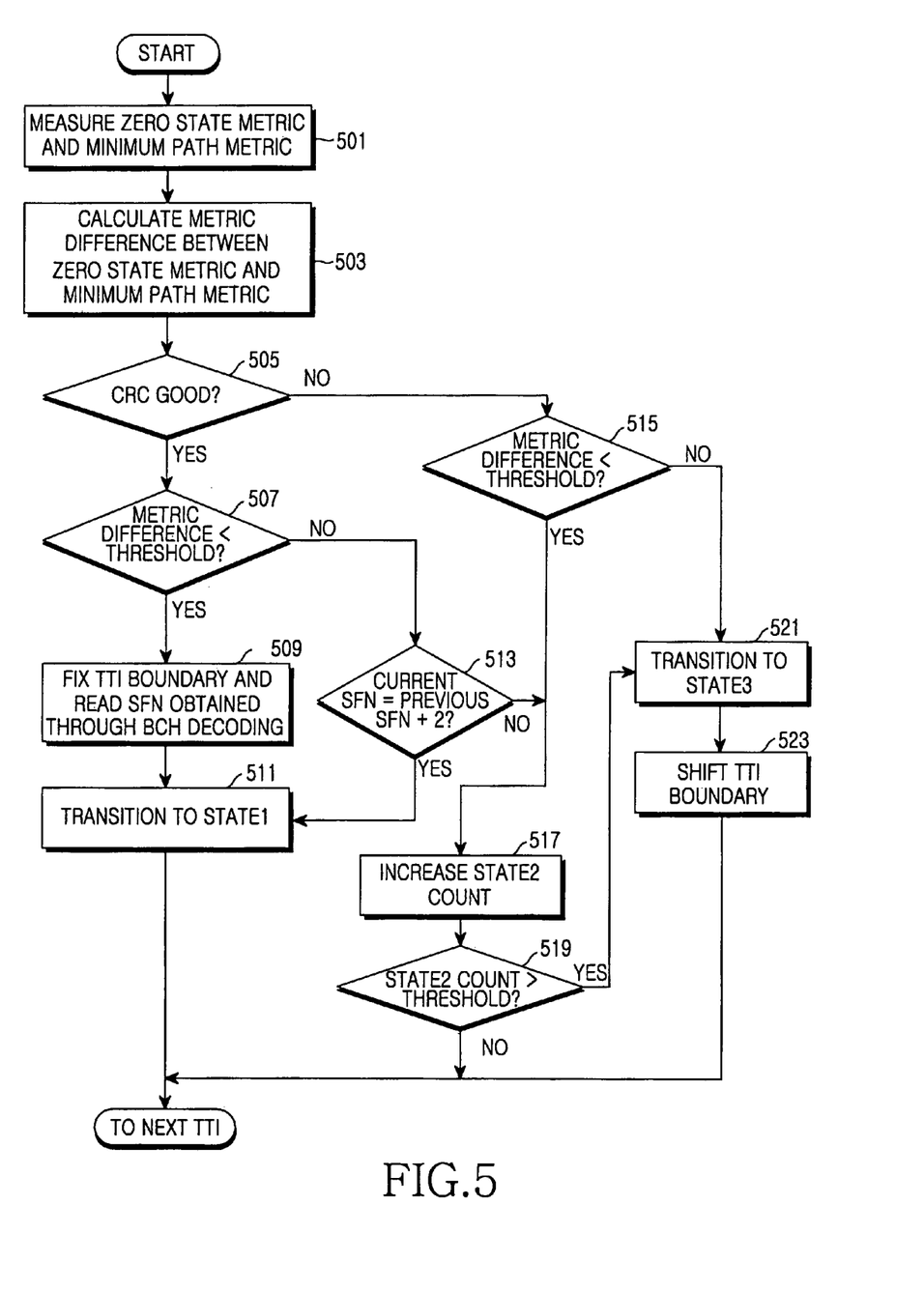
FIG. 5 is a flowchart illustrating a STATE 2 operation of a synchronization detection apparatus according to the present invention.

FIG. 5 shows a STATE 2 operation of a synchronization detection apparatus according to the present invention. An operation of steps 501 to 511 in FIG. 5, in which the synchronization detection apparatus transitions to "STATE 1," is equal to the operation of steps 401 to 411 of FIG. 4, so a description thereof will be omitted.

If the CRC result is "Good" but the path metric difference is greater than or equal to the threshold in step 507, the synchronization detection apparatus compares an SFN corresponding to the previous TTI with an SFN obtained through the current BCH decoding and determines in step 513 whether the current SFN value has increased by 2. If the current SFN value has increased by 2, the synchronization detection apparatus keeps the TTI boundary and uses the SFN and system information obtained through BCH decoding in step 511, determining that the TTI boundary between the UTRAN and the UE is matched. This corresponds to an operation of CASE 2 in Table 2.

However, if it is determined in step 513 that the current SFN value has not increased by 2, i.e. if the current SFN value is kept for a specific TTI, the synchronization detection apparatus increases a count value of "STATE 2" by a predetermined value in step 517, determining that the TTI boundary between the UTRAN and the UE is not matched, and then determines in step 519 whether the increased count value of "STATE 2" is greater than a threshold. If the increased count value of "STATE 2" is greater than the threshold, the synchronization detection apparatus transitions from the current STATE to "STATE 3" in step 521, and shifts the TTI boundary of the UE one frame in step 523.

If the CRC result is "Bad" in step 505, the synchronization detection apparatus determines in step 515 whether the path metric difference is less than a threshold. If the path metric difference is less than the threshold, the synchronization detection apparatus proceeds to step 517 and performs its succeeding operation. If the CRC result is "Bad" and the path metric difference is also greater than or equal to the threshold in step 515, the synchronization detection apparatus proceeds to step 521 where it transitions from the current state to "STATE 3", determining that the TTI boundary between the UTRAN and the UE is mismatched, for example, one frame. In step 523, the synchronization detection apparatus shifts the TTI boundary of the UE one frame, and then waits until the next TTI boundary.

Figure 6:
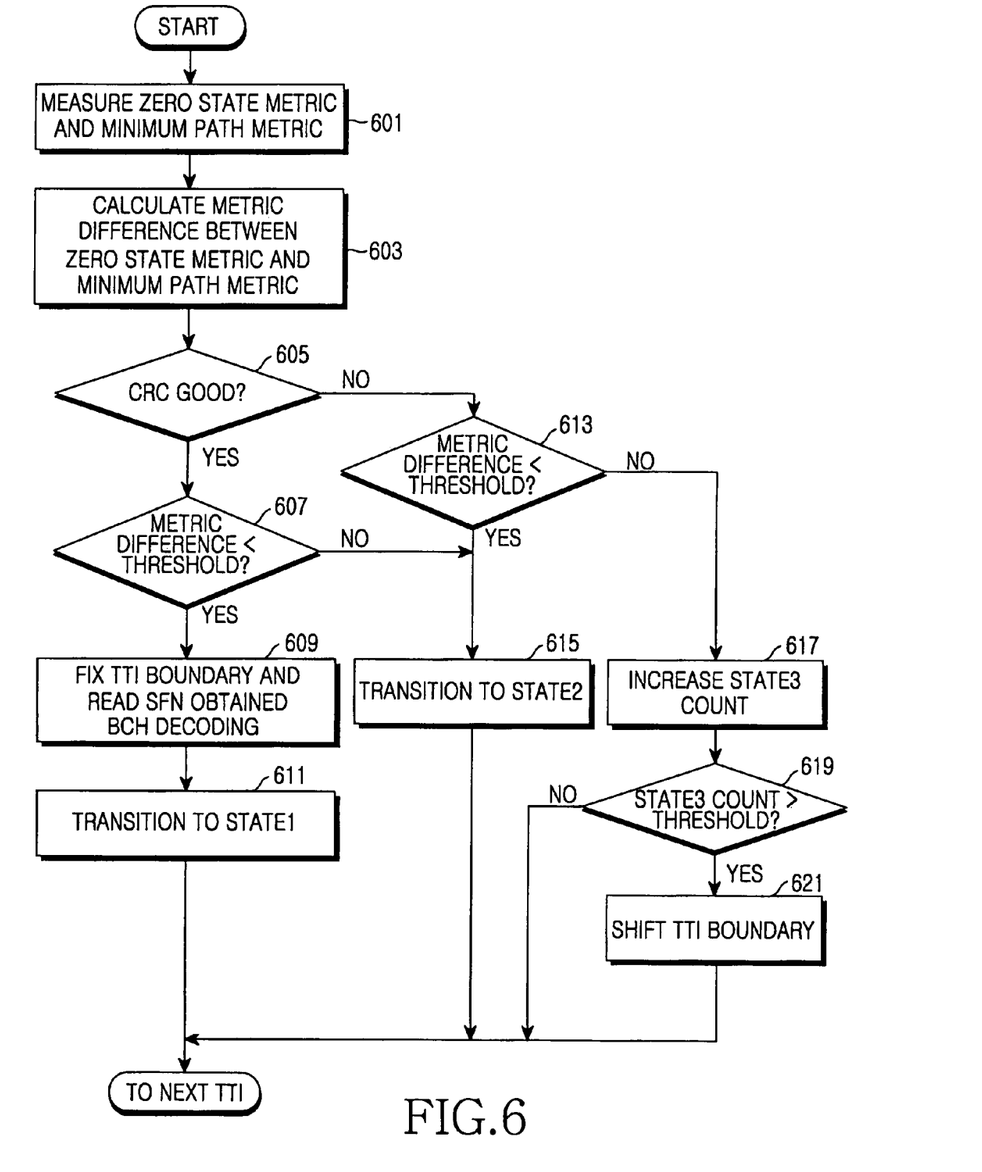
FIG. 6 is a flowchart illustrating a STATE 3 operation of a synchronization detection apparatus according to the present invention.

FIG. 6 shows a STATE 3 operation of a synchronization detection apparatus according to the present invention. An operation of steps 601 to 615 in FIG. 6, in which the synchronization detection apparatus transitions to "STATE 3," is equal to the operation of steps 401 to 415 of FIG. 4, so a description thereof will be omitted.

If the CRC result is "Bad" in step 605 and the path metric difference is greater than or equal to a threshold in step 613, the synchronization detection apparatus increases a count value for "STATE 3" by a predetermined value in step 617. Thereafter, the synchronization detection apparatus determines in step 619 if the count value for "STATE 3" is greater than a threshold. If the count value for "STATE 3" is greater than the threshold, the synchronization detection apparatus shifts the TTI boundary of the UE one frame in step 621, determining that the TTI boundary between the UTRAN and the UE is mismatched, for example, one frame, and then waits until the next TTI boundary.

As can be understood from the foregoing description, in a process of matching a TTI boundary for channel decoding of a BCH in an asynchronous mobile communication system, the present invention can achieve reliable synchronization acquisition even though there is a change in radio environment.

In addition, the present invention can reduce the time used due to a wrong decision on TTI boundary match/mismatch, making it possible to rapidly receive broadcasting information from a corresponding cell after decoding a PCCPCH from a neighbor cell or performing initial cell search.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for detecting Transmission Time Interval (TTI) synchronization of a Broadcasting Channel (BCH) in an asynchronous mobile communication system, the method comprising:
   calculating a zero state path metric and a minimum path metric through an Add-Compare-Select (ACS) process and a trace-back process during frame decoding of a received BCH;
   performing Cyclic Redundancy Check (CRC) check on the decoded BCH frame; and
   detecting TTI synchronization using the CRC check result and a result obtained by comparing a difference between the zero state path metric and the minimum path metric with a threshold.

2. The method of claim 1, wherein the detection of TTI synchronization comprises:
   determining whether the CRC check result indicates absence of an error;
   determining whether the difference between the zero state path metric and the minimum path metric is less than the threshold when the CRC check result indicates absence of an error; and
   detecting the TTI synchronization and determining that the TTI synchronization is matched when the difference between the zero state path metric and the minimum path metric is less than the threshold.

3. The method of claim 1, further comprising:
   performing TTI synchronization detection, when the TTI synchronization is not detected, on every received BCH frame until the TTI synchronization is detected.

4. The method of claim 3, wherein the performing TTI synchronization detection comprises:
   determining whether the CRC check result indicates absence of an error;
   determining whether the difference between the zero state path metric and the minimum path metric is greater than or equal to the threshold when the CRC check result indicates absence of an error; and
   waiting until a next TTI boundary in order to further determine whether TTI synchronization is matched when the difference between the zero state path metric and the minimum path metric is greater than or equal to the threshold.

5. The method of claim 3, wherein the performing of TTI synchronization detection comprises:
   determining whether the CRC check result indicates presence of an error;
   determining whether the difference between the zero state path metric and the minimum path metric is less than the threshold when the CRC check result indicates presence of an error; and waiting until a next TTI boundary in order to further determine whether TTI synchronization is matched when the difference between the zero state path metric and the minimum path metric is less than the threshold.

6. The method of claim 3, wherein the performing of TTI synchronization detection comprises:
   determining whether the CRC check result indicates presence of an error;
   determining whether the difference between the zero state path metric and the minimum path metric is greater than or equal to the threshold when the CRC check result indicates presence of an error; and
   shifting a TTI boundary one frame and then waiting until a next TTI boundary, and determining that the TTI synchronization is not matched when the difference between the zero state path metric and the minimum path metric is greater than or equal to the threshold.

7. The method of claim 4, further comprising:
   determining whether the CRC check result indicates absence of an error after waiting until the next TTI boundary;
   determining whether the difference between the zero state path metric and the minimum path metric is less than the threshold when the CRC check result indicates absence of an error; and
   detecting the TTI synchronization and determining that the TTI synchronization is matched when the difference between the zero state path metric and the minimum path metric is less than the threshold.

8. The method of claim 4, further comprising:
   determining whether the CRC check result indicates absence of an error after waiting until the next TTI boundary;
   determining whether the difference between the zero state path metric and the minimum path metric is greater than or equal to the threshold when the CRC check result indicates the absence of an error;
   determining whether a current System Frequency Number (SFN) is equal to a previous SFN plus 2 when the difference between the zero state path metric and the minimum path metric is greater than or equal to the threshold; and
   detecting the TTI synchronization, determining that the TTI synchronization is matched when the current SFN is equal to the previous SFN plus 2.

9. The method of claim 4, further comprising:
   determining whether the CRC check result indicates absence of an error after waiting until the next TTI boundary;
   determining whether the difference between the zero state path metric and the minimum path metric is greater than or equal to the threshold when the CRC check result indicates absence of an error;
   determining whether a current SFN is equal to a previous SFN plus 2 when the difference between the zero state path metric and the minimum path metric is greater than or equal to the threshold;
   increasing a count related to a state in which there is a further need for determining whether TTI synchronization is matched, and then determining whether the increased count is greater than a reference count when the current SFN is not equal to the previous SFN plus 2; and
   waiting until the next TTI boundary in order to further determine whether TTI synchronization is matched when the increased count is greater than the reference count.

10. The method of claim 4, further comprising:
    determining whether the CRC check result indicates absence of an error after waiting until the next TTI boundary;
    determining whether the difference between the zero state path metric and the minimum path metric is greater than or equal to the threshold when the CRC check result indicates absence of an error;
    determining whether a current SFN is equal to a previous SFN plus 2 when the difference between the zero state path metric and the minimum path metric is greater than or equal to the threshold;
    increasing a count related to a state in which there is a further need for determining whether TTI synchronization is matched, and then determining whether the increased count is less than or equal to a reference count when the current SFN is not equal to the previous SFN plus 2; and
    shifting a TTI boundary one frame and then waiting until a next TTI boundary, and determining that the TTI synchronization is not matched when the increased count is less than or equal to the reference count.

11. The method of claim 5, further comprising:
    determining whether the CRC check result indicates absence of an error after waiting until the next TTI boundary;
    determining whether the difference between the zero state path metric and the minimum path metric is less than the threshold when the CRC check result indicates absence of an error; and
    detecting the TTI synchronization, determining that the TTI synchronization is matched when the difference between the zero state path metric and the minimum path metric is less than the threshold.

12. The method of claim 5, further comprising:
    determining whether the CRC check result indicates absence of an error after waiting until the next TTI boundary;
    determining whether the difference between the zero state path metric and the minimum path metric is greater than or equal to the threshold when the CRC check result indicates absence of an error;
    determining whether a current SFN is equal to a previous SFN plus 2 when the difference between the zero state path metric and the minimum path metric is greater than or equal to the threshold; and
    detecting the TTI synchronization, and determining that the TTI synchronization is matched when the current SFN is equal to the previous SFN plus 2.

13. The method of claim 5, further comprising:
    determining whether the CRC check result indicates absence of an error after waiting until the next TTI boundary;
    determining whether the difference between the zero state path metric and the minimum path metric is greater than or equal to the threshold when the CRC check result indicates absence of an error;
    determining whether a current SFN is equal to a previous SFN plus 2 when the difference between the zero state path metric and the minimum path metric is greater than or equal to the threshold;
    increasing a count related to a state in which there is a further need for determining whether TTI synchronization is matched, and then determining whether the increased count is greater than a reference count when the current SFN is not equal to the previous SFN plus 2; and waiting until a next TTI boundary in order to further determine whether TTI synchronization is matched when the increased count is greater than the reference count.

14. The method of claim 5, further comprising:
determining whether the CRC check result indicates absence of an error after waiting until the next TTI boundary;
determining whether the difference between the zero state path metric and the minimum path metric is greater than or equal to the threshold when the CRC check result indicates absence of an error;
determining whether a current SFN is equal to a previous SFN plus 2 when the difference between the zero state path metric and the minimum path metric is greater than or equal to the threshold;
increasing a count related to a state in which there is a further need for determining whether TTI synchronization is matched, and then determining whether the increased count is less than or equal to a reference count when the current SFN is not equal to the previous SFN plus 2; and
shifting a TTI boundary one frame and then waiting until a next TTI boundary, determining that the TTI synchronization is not matched when the increased count is less than or equal to the reference count.

15. The method of claim 6, further comprising:
determining whether the CRC check result indicates absence of an error after waiting until the next TTI boundary;
determining whether the difference between the zero state path metric and the minimum path metric is less than the threshold when the CRC check result indicates absence of an error; and
detecting the TTI synchronization, determining that the TTI synchronization is matched when the difference between the zero state path metric and the minimum path metric is less than the threshold.

16. The method of claim 6, further comprising:
determining whether the CRC check result indicates absence of an error after waiting until the next TTI boundary;
determining whether the difference between the zero state path metric and the minimum path metric is greater than or equal to the threshold when the CRC check result indicates absence of an error; and
waiting until a next TTI boundary in order to further determine whether TTI synchronization is matched when the difference between the zero state path metric and the minimum path metric is greater than or equal to the threshold.

17. The method of claim 6, further comprising:
determining whether the CRC check result indicates presence of an error after waiting until the next TTI boundary;
determining whether the difference between the zero state path metric and the minimum path metric is less than the threshold when the CRC check result indicates presence of an error; and
waiting until a next TTI boundary in order to further determine whether TTI synchronization is matched when the difference between the zero state path metric and the minimum path metric is less than the threshold.

18. The method of claim 6, further comprising:
determining whether the CRC check result indicates presence of an error after waiting until the next TTI boundary;
determining whether the difference between the zero state path metric and the minimum path metric is greater than or equal to the threshold when the CRC check result indicates presence of an error; and
increasing a count related to a state in which TTI synchronization is not matched when the difference between the zero state path metric and the minimum path metric is greater than or equal to the threshold, and shifting a TTI boundary one frame and then waiting until a next TTI boundary, determining that the TTI synchronization is not matched when the increased count is greater than a reference count.

19. The method of claim 6, further comprising:
determining whether the CRC check result indicates presence of an error after waiting until the next TTI boundary;
determining whether the difference between the zero state path metric and the minimum path metric is greater than or equal to the threshold when the CRC check result indicates presence of an error; and
increasing a count related to a state in which TTI synchronization is not matched when the difference between the zero state path metric and the minimum path metric is greater than or equal to the threshold, and waiting until a next TTI boundary in order to further determine whether the TTI synchronization is matched when the increased count is less than or equal to a reference count.

20. An apparatus for detecting synchronization of a Broadcasting Channel (BCH) in an asynchronous mobile communication system, the apparatus comprising:
a Viterbi decoder for calculating a zero state path metric and a minimum path metric through an Add-Compare-Select (ACS) process and a trace-back process while decoding a frame of a received BCH;
a Cyclic Redundancy Check (CRC) checker for performing CRC check on the decoded BCH frame; and
a controller for detecting Transmission Time Interval (TTI) synchronization of the received BCH using the CRC check result and a result obtained by comparing a difference between the zero state path metric and the minimum path metric with a threshold.

21. The apparatus of claim 20, wherein the controller:
detects the TTI synchronization and determines that the TTI synchronization is matched when the CRC check result indicates absence of an error and the difference between the zero state path metric and the minimum path metric is less than the threshold.

22. The apparatus of claim 20, wherein the controller:
performs TTI synchronization detection on every received BCH frame until the TTI synchronization is detected when the TTI synchronization is not detected.

23. The apparatus of claim 22, wherein the controller comprises:
a state machine for performing a predetermined state transition operation for detection of TTI synchronization of a received BCH; and
a TTI synchronization detector for determining whether the TTI synchronization is detected, using the CRC check result and the result obtained by comparing the difference between the zero state path metric and the minimum path metric with the threshold, and detecting TTI synchronization by performing state transition through the state machine for every received BCH frame until the TTI synchronization is detected.

24. The apparatus of claim 22, wherein when the TTI synchronization is not detected, the controller:
waits until a next TTI boundary in order to further determine whether TTI synchronization is matched when the CRC check result indicates absence of an error and the difference between the zero state path metric and the minimum path metric is greater than or equal to the threshold.

25. The apparatus of claim 22, wherein when the TTI synchronization is not detected, the controller:
    waits until a next TTI boundary in order to further determine whether TTI synchronization is matched when the CRC check result indicates presence of an error and the difference between the zero state path metric and the minimum path metric is less than the threshold.

26. The apparatus of claim 22, wherein when the TTI synchronization is not detected, the controller:
    shifts a TTI boundary one frame and then waits until a next TTI boundary and determines that the TTI synchronization is not matched when the CRC check result indicates presence of an error and the difference between the zero state path metric and the minimum path metric is greater than or equal to the threshold.

27. The apparatus of claim 24, wherein after waiting until the next TTI boundary, the controller:
    detects the TTI synchronization, determining that the TTI synchronization is matched when the CRC check result indicates absence of an error and the difference between the zero state path metric and the minimum path metric is less than the threshold.

28. The apparatus of claim 24, wherein after waiting until the next TTI boundary, the controller:
    detects the TTI synchronization and determines that the TTI synchronization is matched when the CRC check result indicates absence of an error, the difference between the zero state path metric and the minimum path metric is greater than or equal to the threshold, and a current System Frequency Number (SFN) is equal to a previous SFN plus 2.

29. The apparatus of claim 24, wherein after waiting until the next TTI boundary, the controller:
    increases a count related to a state in which there is a further need for determining whether TTI synchronization is matched, and then determines whether the increased count is greater than a reference count when the CRC check result indicates absence of an error, the difference between the zero state path metric and the minimum path metric is greater than or equal to the threshold, and a current SFN is not equal to a previous SFN plus 2; and
    waits until a next TTI boundary in order to further determine whether TTI synchronization is matched when the increased count is greater than the reference count.

30. The apparatus of claim 24, wherein after waiting until the next TTI boundary, the controller:
    increases a count related to a state in which there is a further need for determining whether TTI synchronization is matched, and then determines whether the increased count is less than or equal to a reference count when the CRC check result indicates absence of an error, the difference between the zero state path metric and the minimum path metric is greater than or equal to the threshold, and a current SFN is not equal to a previous SFN plus 2; and
    shifts a TTI boundary one frame and then waits until a next TTI boundary and determines that the TTI synchronization is not matched when the increased count is less than or equal to the reference count.

31. The apparatus of claim 25, wherein after waiting until the next TTI boundary, the controller:
    detects the TTI synchronization, determining that the TTI synchronization is matched when the CRC check result indicates absence of an error and the difference between the zero state path metric and the minimum path metric is less than the threshold.

32. The apparatus of claim 25, wherein after waiting until the next TTI boundary, the controller:
    detects the TTI synchronization determines that the TTI synchronization is matched when the CRC check result indicates absence of an error, the difference between the zero state path metric and the minimum path metric is greater than or equal to the threshold, and a current SFN is equal to a previous SFN plus 2.

33. The apparatus of claim 25, wherein after waiting until the next TTI boundary, the controller:
    increases a count related to a state in which there is a further need for determining whether TTI synchronization is matched, and determines whether the increased count is greater than a reference count when the CRC check result indicates absence of an error, the difference between the zero state path metric and the minimum path metric is greater than or equal to the threshold, and a current SFN is not equal to a previous SFN plus 2; and
    waits until a next TTI boundary in order to further determine whether TTI synchronization is matched when the increased count is greater than the reference count.

34. The apparatus of claim 25, wherein after waiting until the next TTI boundary, the controller:
    increases a count related to a state in which there is a further need for determining whether TTI synchronization is matched, and then determines whether the increased count is less than or equal to a reference count when the CRC check result indicates absence of an error, the difference between the zero state path metric and the minimum path metric is greater than or equal to the threshold, and a current SFN is not equal to a previous SFN plus 2; and
    shifts a TTI boundary one frame and then waits until a next TTI boundary, determining that the TTI synchronization is not matched when the increased count is equal to or less than the reference count.

35. The apparatus of claim 26, wherein after waiting until the next TTI boundary, the controller:
    detects the TTI synchronization, determining that the TTI synchronization is matched when the CRC check result indicates absence of an error and the difference between the zero state path metric and the minimum path metric is less than the threshold.

36. The apparatus of claim 26, wherein after waiting until the next TTI boundary, the controller:
    waits until a next TTI boundary in order to further determine whether TTI synchronization is matched when the CRC check result indicates absence of an error and the difference between the zero state path metric and the minimum path metric is greater than or equal to the threshold.

37. The apparatus of claim 26, wherein after waiting until the next TTI boundary, the controller:
    waits until a next TTI boundary in order to further determine whether TTI synchronization is matched when the CRC check result indicates presence of an error and the difference between the zero state path metric and the minimum path metric is less than the threshold.

38. The apparatus of claim 26, wherein after waiting until the next TTI boundary, the controller:
    if the CRC check result indicates presence of an error and the difference between the zero state path metric and the minimum path metric is greater than or equal to the threshold, increases a count related to a state in which TTI synchronization is not matched when the CRC check result indicates presence of an error and the difference between the zero state path metric and the minimum path metric is greater than or equal to the threshold, and shifts a TTI boundary one frame and then waits until a next TTI boundary and determines that the TTI synchronization is not matched when the increased count is greater than a reference count.

39. The apparatus of claim 26, wherein after waiting until the next TTI boundary, the controller:
increases a count related to a state in which TTI synchronization is not matched when the CRC check result indicates presence of an error and the difference between the zero state path metric and the minimum path metric is greater than or equal to the threshold, and waits until a next TTI boundary in order to further determine whether the TTI synchronization is matched when the increased count is less than or equal to a reference count.

* * * * *